(12) United States Patent
Iwamoto et al.

(10) Patent No.: US 6,825,537 B2
(45) Date of Patent: Nov. 30, 2004

(54) VERTICAL FIELD EFFECT TRANSISTOR

(75) Inventors: Susumu Iwamoto, Nagano (JP); Yasuhiko Onishi, Nagano (JP); Takahiro Sato, Nagano (JP); Tatsuji Nagaoka, Nagano (JP)

(73) Assignee: Fuji Electric Device Technology Co., Ltd. (JP)

(*) Notice: Subject to any disclaimer, the term of this patent is extended or adjusted under 35 U.S.C. 154(b) by 0 days.

(21) Appl. No.: 10/683,868

(22) Filed: Oct. 10, 2003

(65) Prior Publication Data

US 2004/0135228 A1 Jul. 15, 2004

(30) Foreign Application Priority Data

Oct. 10, 2002 (JP) .................................... 2002-298068

(51) Int. Cl.[7] .................... H01L 29/76; H01L 29/94; H01L 31/062; H01L 31/113; H01L 31/119
(52) U.S. Cl. ............................ 257/409; 257/329
(58) Field of Search ................ 257/329, 330, 257/331, 332, 333, 342, 343, 345, 347, 327, 328, 334, 409

(56) References Cited

U.S. PATENT DOCUMENTS

| 5,216,275 A | 6/1993 | Chen ......................... 257/493 |
| 6,639,260 B2 * | 10/2003 | Suzuki et al. ............... 257/288 |

FOREIGN PATENT DOCUMENTS

| JP | 2001-135819 A | 5/2001 |
| JP | 2001-230413 A | 8/2001 |
| JP | 2001-298190 A | 10/2001 |
| JP | 2001-298191 A | 10/2001 |

* cited by examiner

Primary Examiner—Long Pham
Assistant Examiner—Dana Farahani
(74) Attorney, Agent, or Firm—Rossi & Associates

(57) ABSTRACT

In a trench super junction semiconductor element having a parallel p-n junction layer 14 with n-drift regions 12 and p-partition regions 13, both extending in a depth direction, being alternately joined, a part 20 in a shape of a three-dimensional curved surface in the end portion of each of trenches is formed in a p-partition region 13. A section in the p-partition region 13 surrounding the part 20 in a shape of a three-dimensional curved surface of the end portion of each of the trenches is made as a p[+]-region 21 in which an impurity concentration is higher than that in a section thereunder so that an electric field is increased at a boundary between the p[+]-region 21 and the n-drift region 12, thereby lessening electric field concentration to the part 20 in a shape of a three-dimensional curved surface of the end portion of the trench. Moreover, the section in the p-partition region 13 surrounding the part 20 in a shape of a three-dimensional curved surface in the end portion of the trench can be formed wider than the section thereunder. This inhibits lowering in a breakdown voltage and, along with this, increases reliability of a gate insulator film.

5 Claims, 16 Drawing Sheets

VERTICAL FIELD EFFECT TRANSISTOR

BACKGROUND OF THE INVENTION

1. Field of the Invention

The present invention relates to a semiconductor element having a parallel p-n junction layer with an arrangement of alternately joining a plurality of drift regions made up of a first conduction type semiconductor and a plurality of partition regions made up of a second conduction type semiconductor. The drift regions extend from a first principal surface side of a semiconductor substrate toward a second principal surface side thereof, the partition regions extend in the same way as the drift regions, and both regions are joined in a direction crossing the direction in which the regions extend. The parallel p-n junction layer becomes a drift layer that allows a current to flow when the semiconductor element is in a turned-on state and becomes depleted when in a turned-off state. The invention particularly relates to a MOSFET (Insulated-gate field effect transistor), an IGBT (Insulated-gate bipolar transistor) and a semiconductor which is a applicable to a bipolar transistor etc., and can be provided with compatibility between a high breakdown voltage capability and a high current capacity capability.

2. Description of the Related Art

Semiconductor elements may be generally classified into lateral elements and vertical elements. A lateral element is provided with electrodes on one of surfaces of a semiconductor substrate to allow a current to flow in a direction in parallel with a principal surface. A vertical element is provided with electrodes on both surfaces of a semiconductor substrate to allow a current to flow in a direction perpendicular to the principal surface. In the vertical semiconductor element, a direction in which a drift current flows when the element is made turned-on is the same as a direction in which a depletion layer is extended by a reverse bias voltage applied when the element is made turned-off. For example, in an ordinary planer n-channel vertical MOSFET, a section of an n⁻-drift layer with high resistance operates as a region of allowing a drift current to flow in the vertical direction when the MOSFET is in a turned-on state and becomes a depletion region when the MOSFET is in a turned-off state to increase the breakdown voltage.

To shorten a current path in the n⁻-drift layer with high resistance is to lower drift resistance to a current. This leads to an effect of reducing substantial on-resistance of the MOSFET. However, the expanding width of a depletion layer between a drain and a base, traveling from the p-n junction between a p-base region and the n⁻-drift region, is adversely narrow. This makes electric field strength in the depletion layer quickly reach the critical electric field strength of silicon to reduce the breakdown voltage. Conversely, in a semiconductor device with a high breakdown voltage, the n⁻-drift layer is provided as being thick, by which on-resistance is inevitably made increased to result in increased loss. That is, there is a tradeoff between the on-resistance and the breakdown voltage.

It is known that the same tradeoff holds also for such semiconductor elements as IGBTs, bipolar transistors and diodes. Moreover, the problem is common to a lateral semiconductor element in which the flowing direction of a drift current when the element is turned-on differs from the travelling direction of a depletion layer expanded by a reverse bias voltage applied when the element is turned-off. As measures for solving the problem, structures of semiconductor devices are disclosed in, for example, EP-B 0 053 854, U.S. Pat. No. 5,216,275, U.S. Pat. No. 5,438,215 and JP-A-9-266311. In each of the disclosed structures, a drift layer is arranged with a parallel p-n junction layer in which highly doped n-type regions and p-type regions are alternately disposed. The parallel p-n junction layer becomes a depletion layer when the device is in a turned-off state so as to bear a voltage to withstand.

The structural difference between the above semiconductor device and an ordinary planer n-channel vertical MOSFET is that the drift layer is not made up of a layer with a uniform and single conduction type, but of the above-described parallel p-n junction layer. In the parallel p-n junction layer, when the element is in a turned-off state, from each of the p-n junction aligned in the vertical direction of the parallel p-n structure, a depletion layer expands in the lateral direction on both sides of the p-n junction even though an impurity concentration is high. This brings the whole drift region to become a depletion region to allow the device to have a high breakdown voltage. In the specification, the semiconductor element provided with a drift section with such a parallel p-n junction structure is to be referred to as a super junction semiconductor element.

Incidentally, on-resistance of a planer super junction MOSFET (Ron·A) is generally expressed approximately by the following expression (1), where resistance of a source layer is denoted by $R_s$, channel resistance is denoted by $R_{ch}$, resistance of an accumulation layer is denoted by $R_{acc}$, resistance by a junction FET (JFET) effect is denoted by $R_{JFET}$, drift resistance is denoted by $R_{drift}$, resistance of a drain layer is denoted by $R_d$ and an area of a region causing the on-resistance is denoted by A:

$$Ron \cdot A = (R_s + R_{ch} + R_{acc} + R_{JFET} + R_{drift} + R_d) \cdot A. \quad (1)$$

In the super junction semiconductor element, the drift resistance $R_{drift}$ is given by the following expression (2). Therefore, even though a breakdown voltage is increased, only the drift resistance increases in proportion to the breakdown voltage. This allows dramatic reduction in the on-resistance compared with related MOSFETs. Furthermore, for the same breakdown voltage, by reducing a width d of the n-drift region in the parallel p-n junction layer, the on-resistance can be further reduced. In the expression (2), $\mu$ is a mobility of electrons, $\epsilon_o$ is the permittivity in vacuum, $\epsilon_s$ is the specific permittivity of silicon, Ec is critical electric field strength and Vb is a breakdown voltage:

$$R_{drift} \cdot A = (4 \cdot d \cdot vb)/(\mu \cdot \epsilon_o \cdot \epsilon_s \cdot Ec^2) \quad (2)$$

However, while the drift resistance $R_{drift}$ is dramatically reduced, resistance components other than the drift resistance in the expression (1) become significant. In particular, the proportion of the resistance $R_{JFET}$ in the JFET effect is large in the on-resistance. For improving this, application of a so-called trench MOSFET is proposed in which a gate electrode fills each of trenches dug from the substrate surface for inducing a channel in a section on the side wall of the trench. About a trench super junction semiconductor element, there is a disclosure in, for example, JP-A-2002-76339.

However, also in the case of the trench MOSFET, a voltage withstanding structure section is provided in the same way as in the planer MOSFET. Therefore, when the MOSFET has stripe-like trenches, an end portion of each of the trenches is sometimes formed in a region where the structure of the region changes to that of the voltage withstanding structure section. In such a case, the end portion of the trench formed in a shape of a three-dimensional curved surface causes electric field concentration in a region at the end portion of the trench to bring about possible reduction in a breakdown voltage.

In addition, in a transition stage of being shifted from a turned-on state to a turned-off state, the depletion layer is quickly expanded in the parallel p-n junction structure. This prevents accumulated carriers from escaping to cause the discharged carriers to encounter a strong electric field due to electric field concentration, which makes the carriers easily injected into a gate insulator film as hot carriers. Thus, the gate insulator film is degraded to cause such possible lowering in reliability of the gate insulator film as to bring about reduction in a threshold voltage. The applicant discloses in JP-A-2001-313391 a structure of a planer super junction semiconductor device that can suppress injection of hot carriers into a gate insulator layer. However, it is necessary also for the trench super junction semiconductor element to suppress injection of hot carriers into the gate insulator film.

The invention has been made in view of the foregoing with an object of providing a trench super junction semiconductor element which inhibits reduction in a breakdown voltage, and along with this, has a high reliability of the gate insulator film.

SUMMARY OF THE INVENTION

In order to achieve the above object, the super junction semiconductor element according to the invention has a low resistance layer and a parallel p-n junction layer between a first principal surface and a second principal surface of a semiconductor substrate. The parallel p-n junction layer includes a plurality of first conduction type drift regions and a plurality of second conduction type partition regions. Both of the first conduction type drift regions and the second conduction type partition regions extend in the vertical direction from the first principal surface side toward the second principal surface side. The parallel p-n junction layer has a structure in which the first conduction type drift regions and the second conduction type partition regions are alternately joined in a lateral direction. Moreover, each of the second conduction type partition regions as a part of a plurality of the second conduction type partition regions has a section with an impurity concentration higher than that on the second principal surface side or a section with a width larger than that on the second principal surface side. The sections each with the higher impurity concentration or with the larger width in the second conduction type partition regions as a part have end portions of the trenches therein that are formed on the first principal surface side.

On the inner surface of each of the trenches, there is provided a gate insulator film. Inside of the trench, covered with the gate insulator film, is filled in with a gate electrode. A second conduction type base region is provided on a surface layer on the first principal surface side so as to be in contact with at least a part of a section along a side wall of each trench. In the second conduction type base region, there are provided first conduction type source regions so that each of them is separated from the first conduction type drift regions by the second conduction type base region and is in contact with a section of the gate insulator film along the side wall of each trench.

In the invention, the section with a higher impurity concentration or with a larger width surrounding the end portion of the trench in the second conduction type partition region with the end portion of the trench formed therein can be disposed in the second conduction type partition region in the parallel p-n junction layer disposed in a region in which a current is allowed to flow in a turned-on state. Moreover, all of the first conduction type drift region, the second conduction type partition region and the trench are stripe-like, and the first conduction type drift region and the second conduction type partition region can be approximately perpendicular to the trench. In this case, in addition to the trench approximately perpendicular to the first conduction type drift region and the second conduction type partition region, a second trench perpendicular to the trench can be provided. Both kinds of the trenches can be connected with each other so as to surround a region in which a current is allowed to flow in the turned-on state. The same is for the case in which the first conduction type drift region and the second conduction type partition region are approximately in parallel with the trench. In this case, a structure can be provided in which the trench and a second trench disposed perpendicularly thereto are connected with each other so as to surround a region in which a current is allowed to flow in the turned-on state.

According to the invention, a part in a shape of a three-dimensional curved surface of the end portion of the trench is surrounded by the section with a higher impurity concentration or with a larger width in the second conduction type partition region in the parallel p-n junction layer. This increases electric field strength at a boundary between the section with a higher impurity concentration or with a larger width in the second conduction type partition region and the first conduction type drift region. Therefore, concentration of electric field strength to the part in the shape of the three-dimensional curved surface of the end portion of the trench is lessened.

DESCRIPTION OF THE PREFERRED EMBODIMENTS

Figure 1:
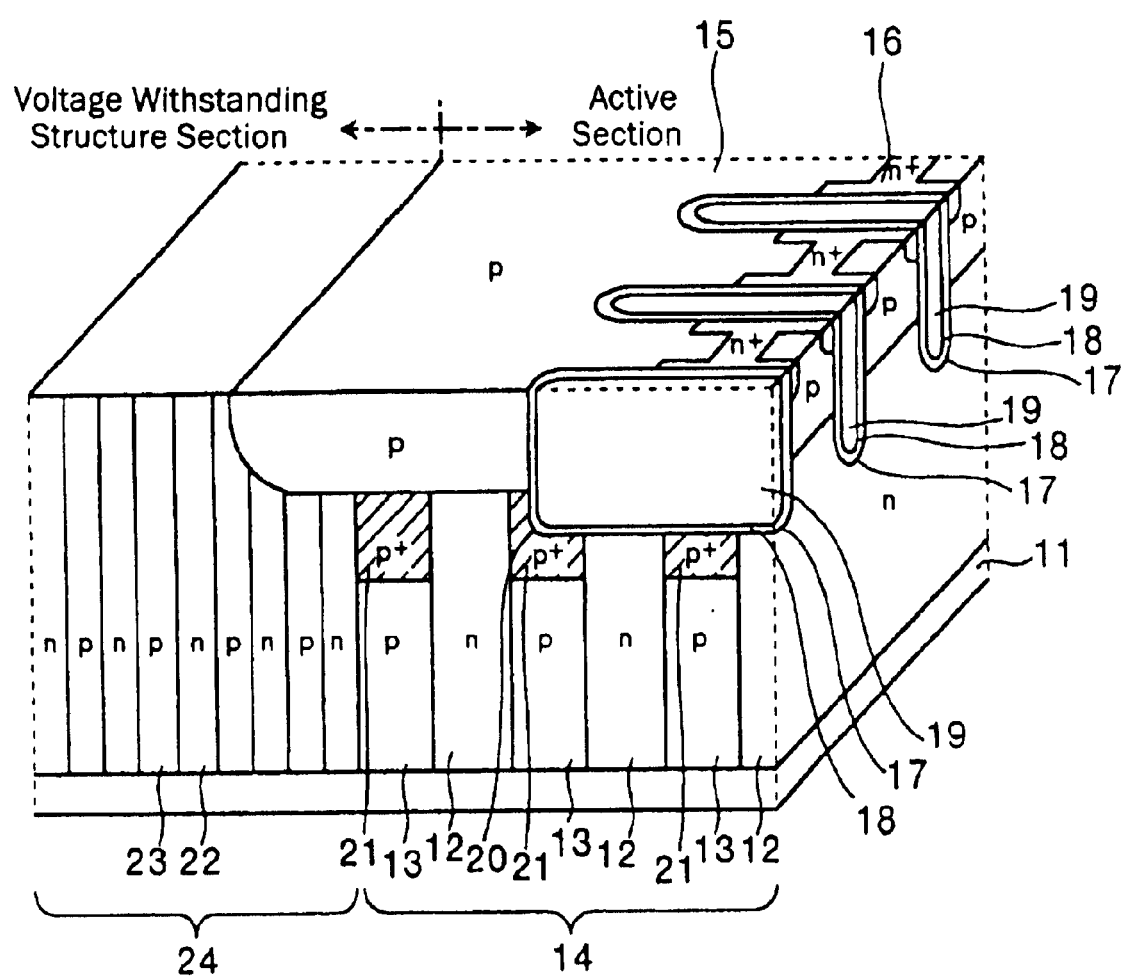
FIG. 1 is a perspective cross sectional view showing an arrangement of a principal part of a super junction semiconductor element according to the embodiment 1 of the invention.

In the following, preferred embodiments according to the invention will be explained in detail with reference to the drawings. In the following explanation and attached drawings, a layer or a region with the additional character or the reference character of "n" or "p" means a layer or a region with electrons or holes taken as major carriers, respectively. Moreover, the index "+" attached to the character "n" or "p" means that the layer or the region has a relatively high impurity concentration. Furthermore, in the following explanation, the first conduction type is referred to as n-type and the second conduction type is referred to as p-type. However, the same is for the case in which the characters "n" and "p" are reversed.

Embodiment 1

FIG. 1 is a perspective cross sectional view showing an arrangement of a principal part of a super junction semiconductor element according to the embodiment 1 of the invention. As shown in FIG. 1, a parallel p-n junction layer 14 is formed on an n$^+$-drain layer 11 that is a low resistance layer. The parallel p-n junction layer 14 has an arrangement in which thin n-drift regions 12 and thin p-partition regions 13 are alternately disposed to be joined to one anther. On the parallel p-n junction layer 14, a p-base region 15 is formed. On the surface layer of the p-base region 15, n$^+$-source regions 16 are formed. Each of the n-drift regions 12 and the p-partition regions 13 is stripe-like in a plan view.

Moreover, in the p-base region 15, trenches 17 are formed which penetrate through the p-base region 15 and the n$^+$-source regions 16 from the surfaces thereof to reach the parallel p-n junction layer 14. Each of the trenches 17 is filled in with a gate electrode 19 with a gate insulator film 18 put between the trench 17 and the gate electrode 18. The trench 17 is formed in a stripe-like shape extending in a direction approximately perpendicular to the n-drift regions 12 and the p-partition regions 13.

A part 20 in a shape of a three-dimensional curved surface in the end portion of the trench 17 is formed so as to be positioned in the p-partition regions 13. A section in the p-partition regions 13 surrounding the part 20 in a shape of a three-dimensional curved surface of the end portion of the trench becomes a p$^+$-region 21 in which an impurity concentration is higher than that in a section thereunder. Here, the region in which the p-base region 15 is provided is an active section that allows a current to flow in a turned-on state. In the active section, in the p-partition region 13 in which no end portion of the trench is positioned, the p$^+$-region 21 with a higher impurity concentration is also provided in the upper half section thereof.

As an example, a standard dimension and a standard impurity concentration in each section is given as follows. About the trench 17, the width is approximately 1am and the depth is approximately 3.5 $\mu$m. About the p$^+$-region 21, the width is approximately 6 $\mu$m, the depth is approximately 12 $\mu$m and the impurity concentration is approximately $4\times10^{15}$cm$^{-3}$. Moreover, about the p-partition region 13, the width is approximately 6 $\mu$m and the impurity concentration is approximately $3.6\times10^{15}$cm$^{-3}$.

About the n-drift region 12, the width is approximately 6 $\mu$m and the impurity concentrations are equal both in a section in contact with the p-partition region 13 and in a section in contact with the p$^+$-region 21 to be approximately $3.6\times10^{15}$cm$^{-3}$. Therefore, in the parallel p-n junction layer 14, a total amount of impurity in a section, with which the part 20 in a shape of a three-dimensional curved surface in the end portion of the trench is in contact, becomes larger compared with that in the case in which no p$^+$-region 21 is provided.

Figure 2:
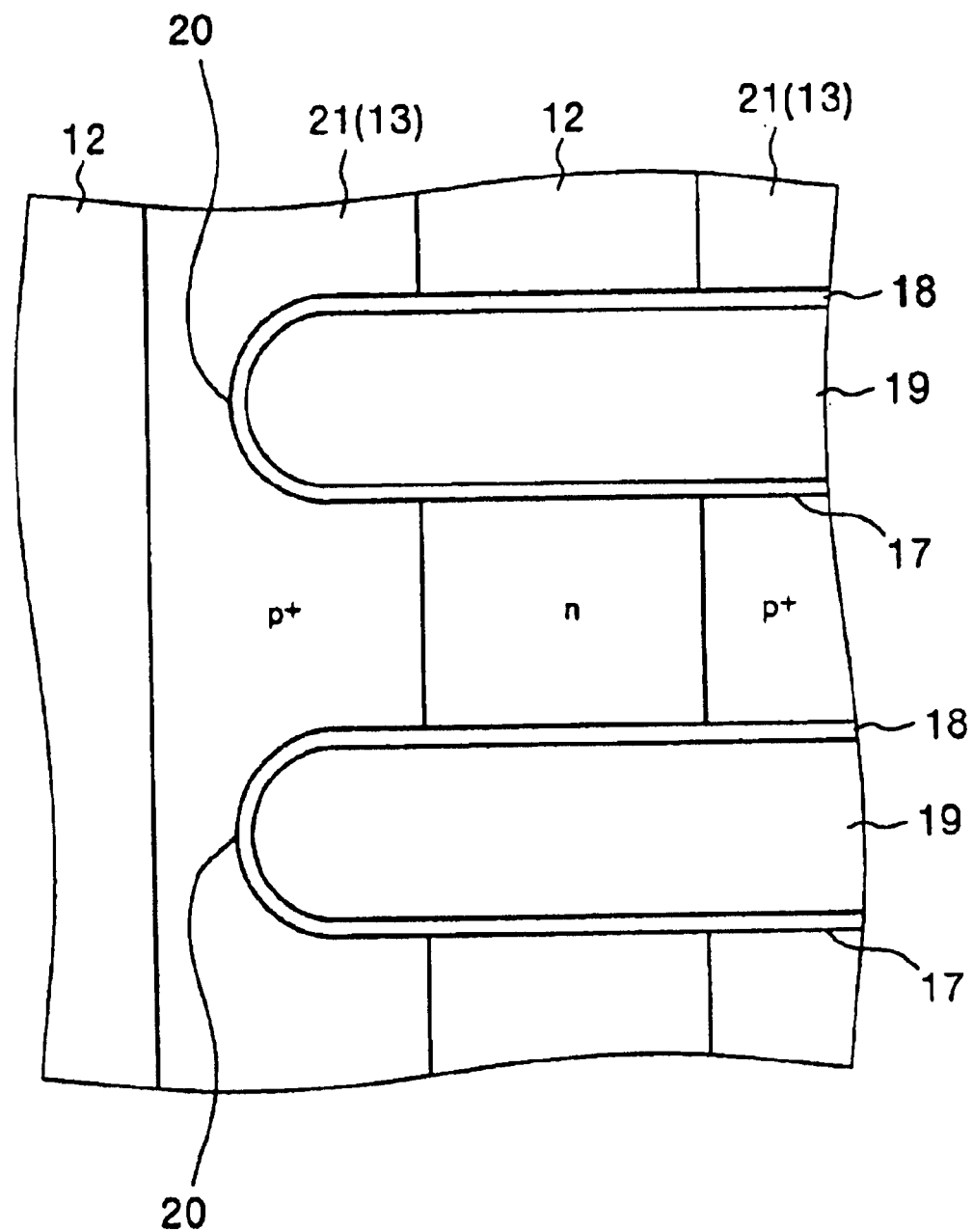
FIG. 2 is a schematic view showing a principal part in a planer structure at a depth near bottom portions of the trenches in the super junction semiconductor element shown in FIG. 1.

FIG. 2 is a schematic view showing a principal part in a planer structure at a depth near bottom portions of the trenches in the super junction semiconductor element shown in FIG. 1. When the width of the trench 17 is on the order of 1 $\mu$m as explained above, the radius of curvature of the part 20 in a shape of a three-dimensional curved surface in the end portion of the trench becomes approximately 0.5 $\mu$m. Thus, the width of a region having the part 20 in a shape of a three-dimensional curved surface becomes on the order of 1 $\mu$m, which is the same order as the trench width. Therefore, as shown in FIG. 2, the part 20 in a shape of a three-dimensional curved surface in the end portion of the trench is to be completely surrounded by the p$^+$-region 21 with the width of 6 $\mu$m.

In FIG. 1, the outside of the active section is shown as a voltage withstanding structure section. In the voltage withstanding structure section, a fine parallel p-n junction layer 14 is disposed for the purpose of lessening an electric field. Each of an n-region 22 and a p-region 23 in the fine parallel p-n junction layer 14 has a width about a half of the width of each of the n-drift region 12 and the p-partition region 13 in the parallel p-n junction layer 14 in the active section. The voltage withstanding structure section is provided with structures such as a field plate structure and a guard ring structure as necessary, although illustration and explanation thereof are omitted. In addition, although illustration is omitted, a source electrode, insulated from the gate electrode 19 by an interlayer insulator film, is in contact with the n$^+$-source regions 16 and the p-base region 15, and a drain electrode is in contact with the n$^+$-drain layer 11.

According to the above-described embodiment 1, when a reverse bias voltage equal to or more than 50V is applied across the p$^+$-region 21 with a high impurity concentration and the n-drift region 12, the parallel p-n junction layer 14 in the active section is completely depleted. However, the p$^+$-region 21, since it completely surrounds the part 20 in a shape of a three-dimensional curved surface in the end portion of the trench, causes an electric field at that time to increase at a boundary between the p+-region 21 and the n-drift region 12. Therefore, the electric field at the part 20 in a shape of a three-dimensional curved surface in the end portion of the trench is relatively lessened. This suppresses hot carriers injected into the gate insulator film 18 of the part 20 in a shape of a three-dimensional curved surface, by which there can be obtained an effect of increasing reliability of the gate insulator film 18. Furthermore, since no breakdown voltage is determined by the part 20 in a shape of a three-dimensional curved surface in the end portion of the trench, it becomes possible to obtain a breakdown voltage as desired.

According to the embodiment 1, the p+-region 21 disposed in the active section makes the breakdown voltage determined in the active section. Thus, an avalanche current is generated in the active section. This makes it possible to avoid the avalanche current concentrating into the part 20 in a shape of a three-dimensional curved surface in the portion of the trench, by which an effect of increasing an avalanche breakdown voltage can be obtained.

Embodiment 2

Figure 3:
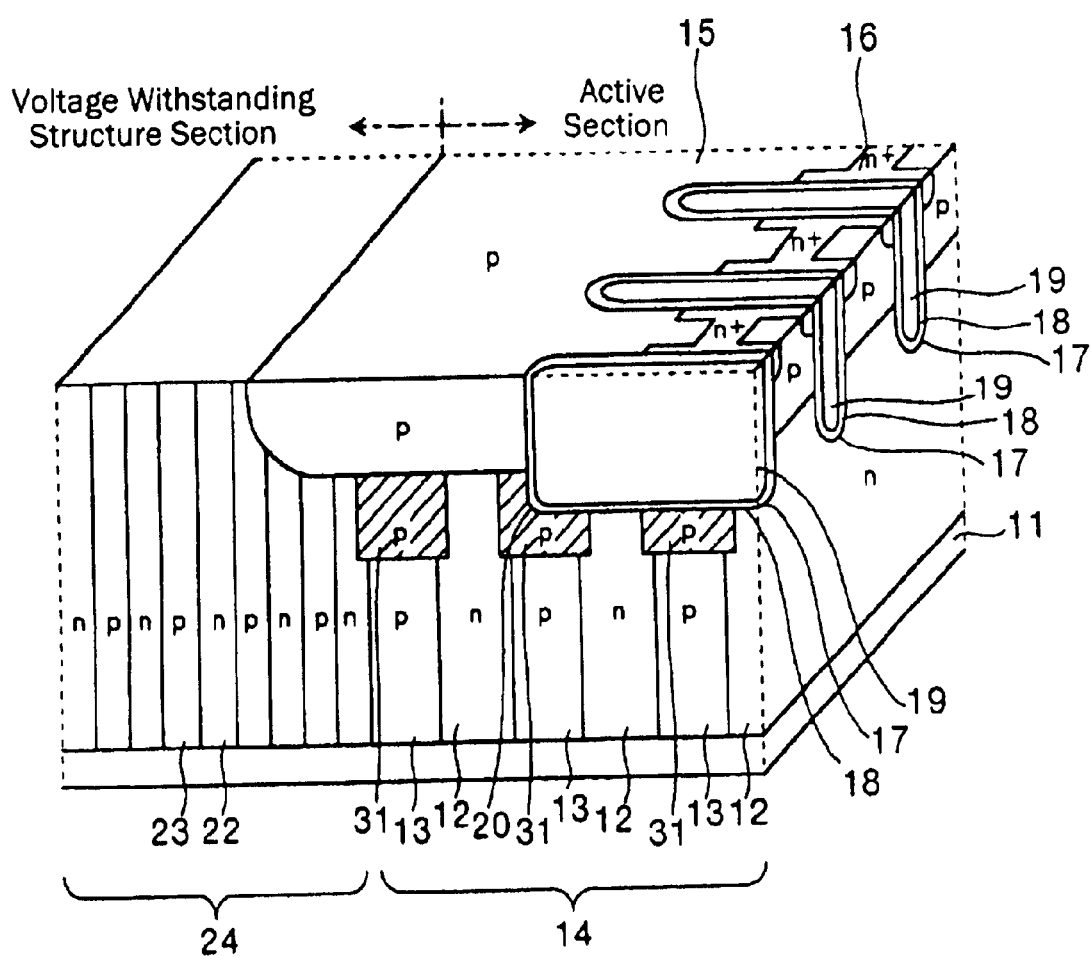
FIG. 3 is a perspective cross sectional view showing an arrangement of a principal part of a super junction semiconductor element according to the embodiment 2 of the invention.
Figure 4:
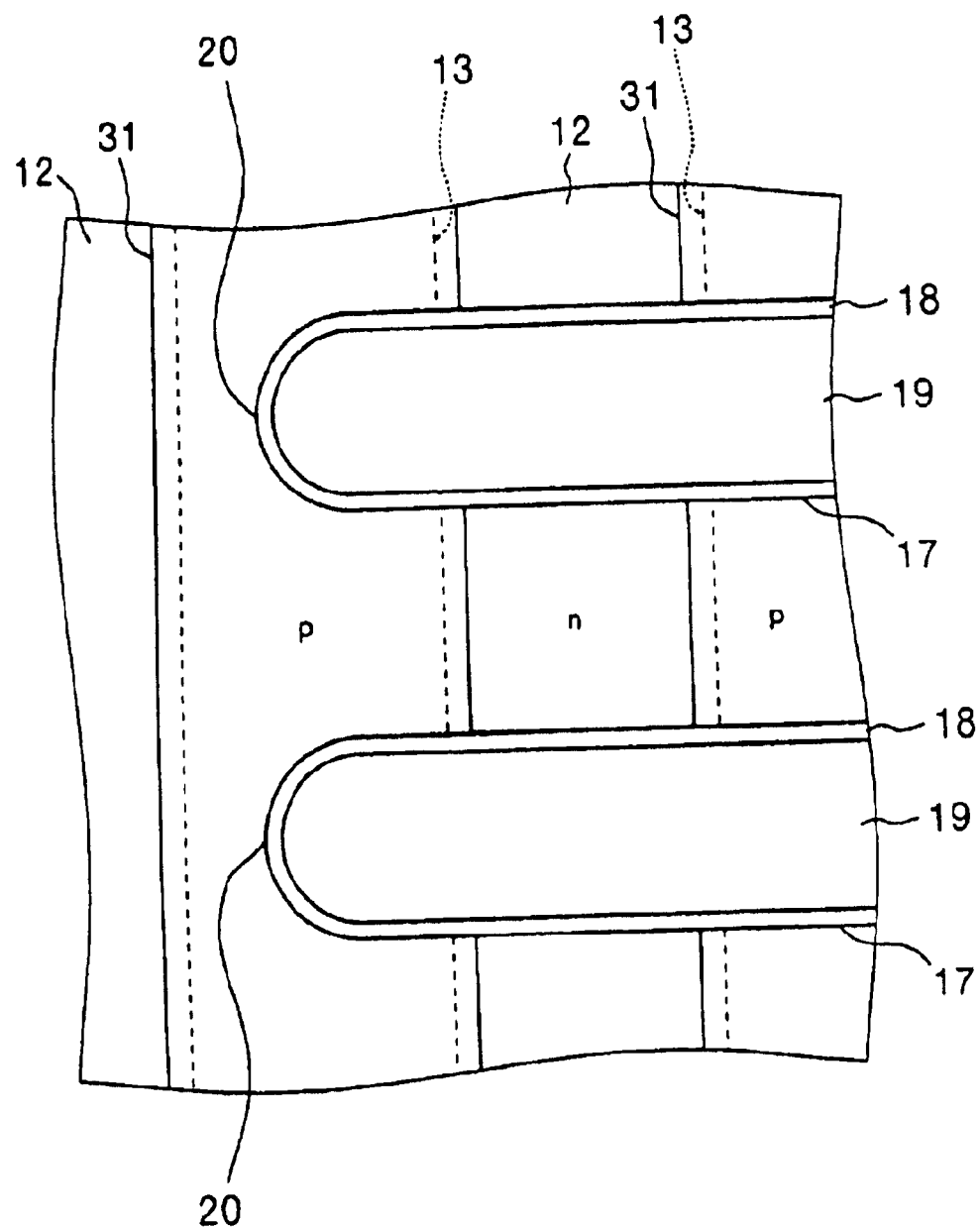
FIG. 4 is a schematic view showing a principal part in a planer structure at a depth near bottom portions of the trenches in the super junction semiconductor element shown in FIG. 3.

FIG. 3 is a perspective cross sectional view showing an arrangement of a principal part of a super junction semiconductor element according to the embodiment 2 of the invention. FIG. 4 is a schematic view showing a principal part in a planer structure at a depth near bottom portions of the trenches in the element. The embodiment 2 differs from the embodiment 1 in that no p+-region 21 is provided and that a section 31 in the p-partition regions 13, surrounding the part 20 in a shape of a three-dimensional curved surface of the end portion of the trench, has a width made to become wider than the width of the section thereunder.

The impurity concentration of the p-partition region 13 including the wider section 31 is uniform and the same as that of an n-drift region 12. The width of the wider section 31 in the p-partition region 13 is, for example, approximately 6.6 μm. Therefore, the width of the section in the n-drift region 12 in contact with the wider section 31 in the p-partition region 13 is approximately 5.4 μm. Like in the embodiment 1, each of the other p-partition regions 13 in the active section is also provided with the wider section 31. The other arrangements, dimensions and impurity concentrations are the same as those in the embodiment 1. About the same arrangement as that in the embodiment 1, the same reference numerals as those in the embodiment 1 are given to the constituents therein and explanations thereof will be omitted.

According to the above-explained embodiment 2, the part 20 in a shape of a three-dimensional curved surface of the end portion of the trench is surrounded by the wider section 31 in the p-partition region 13. Therefore, in the parallel p-n junction layer 14, a total amount of impurity in a section, with which the part 20 in a shape of a three-dimensional curved surface in the end portion of the trench is in contact, becomes larger. This causes an electric field when a reverse bias voltage is applied to the element to increase at a boundary between the wider section 31 in the p-partition region 13 and the n-drift region 12. Therefore, the electric field at the part 20 in a shape of a three-dimensional curved surface in the end portion of the trench is relatively lessened. This, like in the embodiment 1, suppresses hot carriers injected into the gate insulator film 18. Thus, there can be obtained an effect of increasing reliability of the gate insulator film 18, and along with this, allowing a desired breakdown voltage to be obtained. Furthermore, since the wider sections 31 in the p-partition regions 13 are disposed in the active section, an effect of increasing an avalanche breakdown voltage can be obtained like in the embodiment 1.

Embodiment 3

Figure 5:
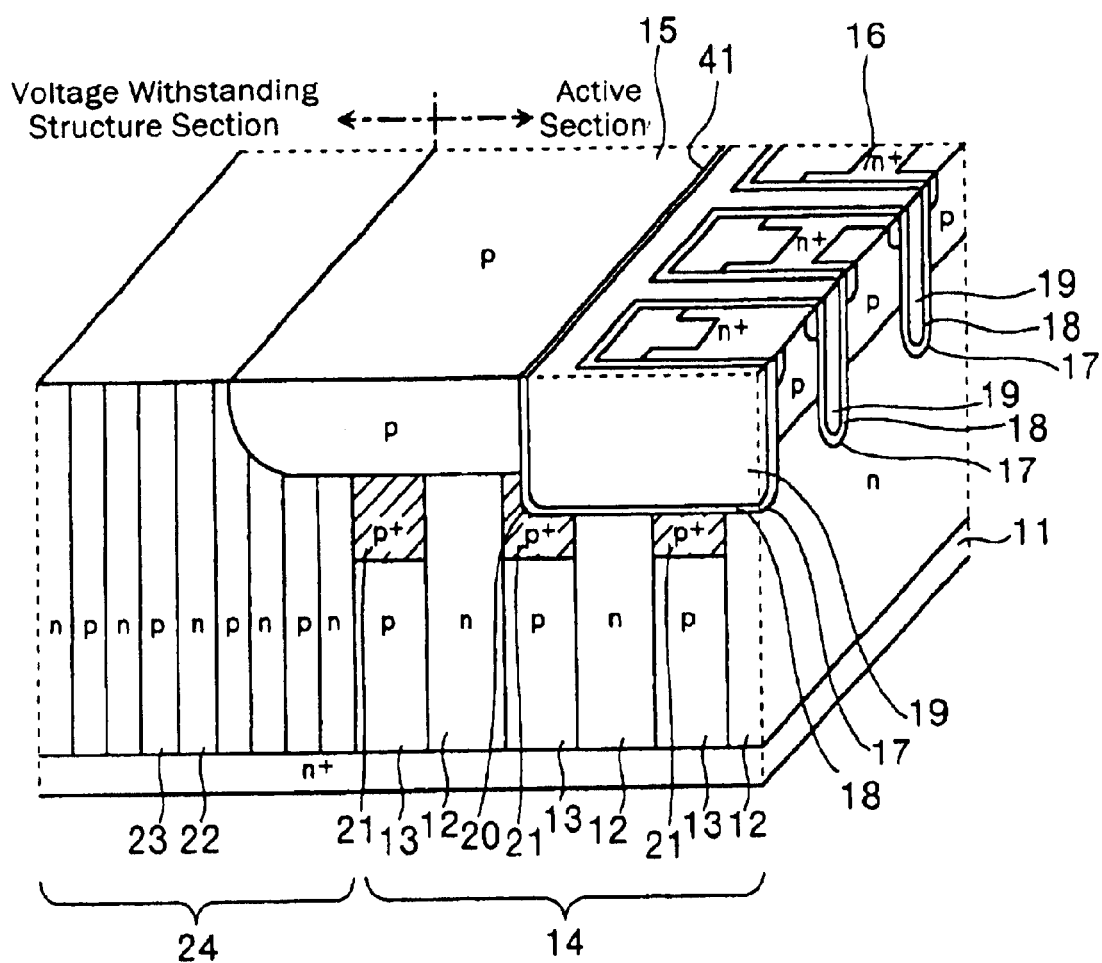
FIG. 5 is a perspective cross sectional view showing an arrangement of a principal part of a super junction semiconductor element according to the embodiment 3 of the invention.
Figure 6:
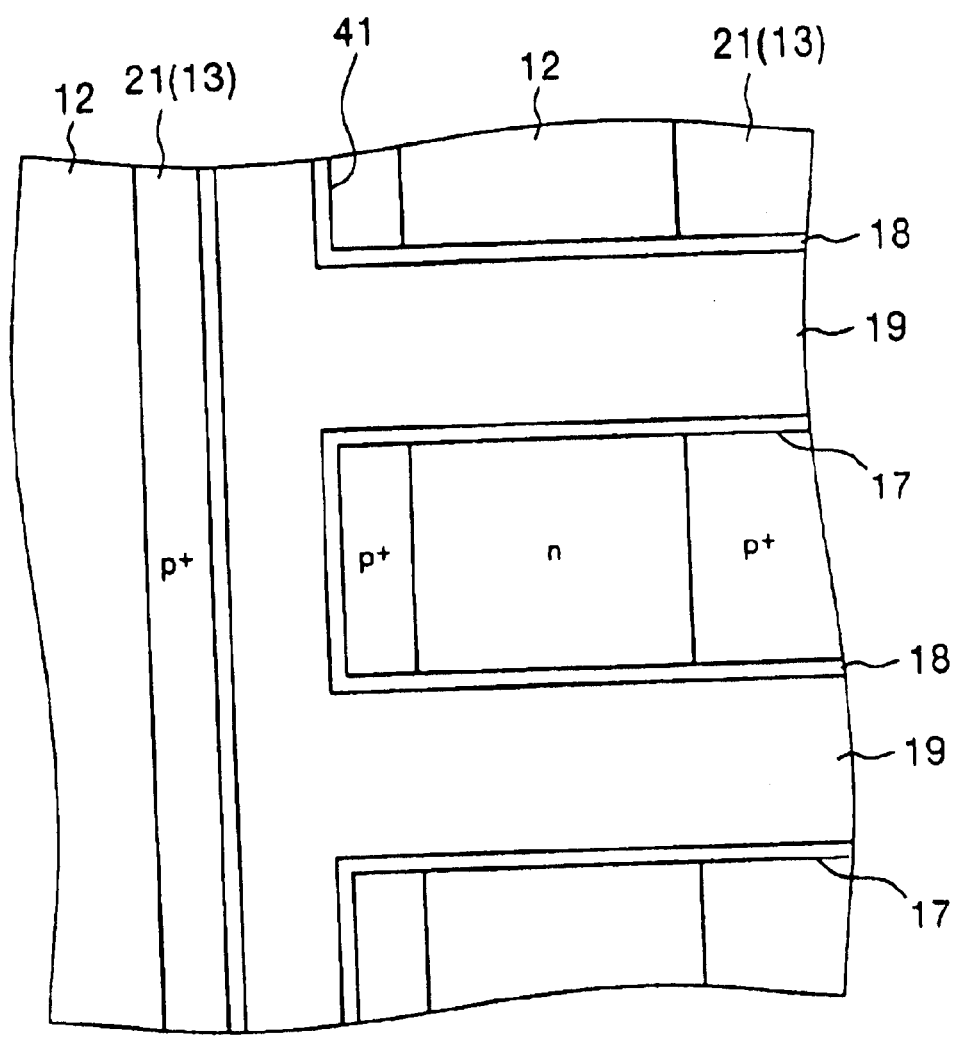
FIG. 6 is a schematic view showing a principal part in a planer structure at a depth near bottom portions of the trenches in the super junction semiconductor element shown in FIG. 5.

FIG. 5 is a perspective cross sectional view showing an arrangement of a principal part of a super junction semiconductor element according to the embodiment 3 of the invention. FIG. 6 is a schematic view showing a principal part in a planer structure at a depth near bottom portions of the trenches in the element. The embodiment 3 has an arrangement in which in the embodiment 1 a second trench 41 is formed in the p+-region 21 in the p-partition region 13 in the active section in parallel with the p-partition region 13. To the second trench 41, there is connected a part 20 in a shape of a three-dimensional curved surface to become an end portion of each of the trenches 17. The second trench 41 is also filled in with the gate electrode 19 with the gate insulator film 18 put between the trench 41 and the gate electrode 18.

The width and the depth of the second trench 41 are the same as those of the trench 17 exemplified in the embodiment 1. Namely, the width is approximately 1 μm and the depth is approximately 3.5 μm. Here, as shown in FIG. 6, the second trench 41 is formed within the p+-region 21 in the p-partition region 13 without protruding from the p+-region 21. The other arrangements, dimensions and impurity concentrations are the same as those in the embodiment 1. About the same arrangement as that in the embodiment 1, the same reference numerals as those in the embodiment 1 are given to the constituents therein and explanations thereof will be omitted.

According to the above-explained embodiment 3, the part 20 in a shape of a three-dimensional curved surface of the end portion of the trench is surrounded by the p+-region 21 in the p-partition region 13. This causes an electric field when a reverse bias voltage is applied to the element to increase at a boundary between the p+-region 21 and the n-drift region 12. Therefore, like in the embodiment 1, injection of hot carriers into the gate insulator film 18 is suppressed. Thus, there can be obtained an effect of increasing reliability of the gate insulator film 18, and along with this, allowing a desired breakdown voltage to be obtained. Furthermore, an effect of increasing an avalanche breakdown voltage can be obtained.

Embodiment 4

Figure 7:
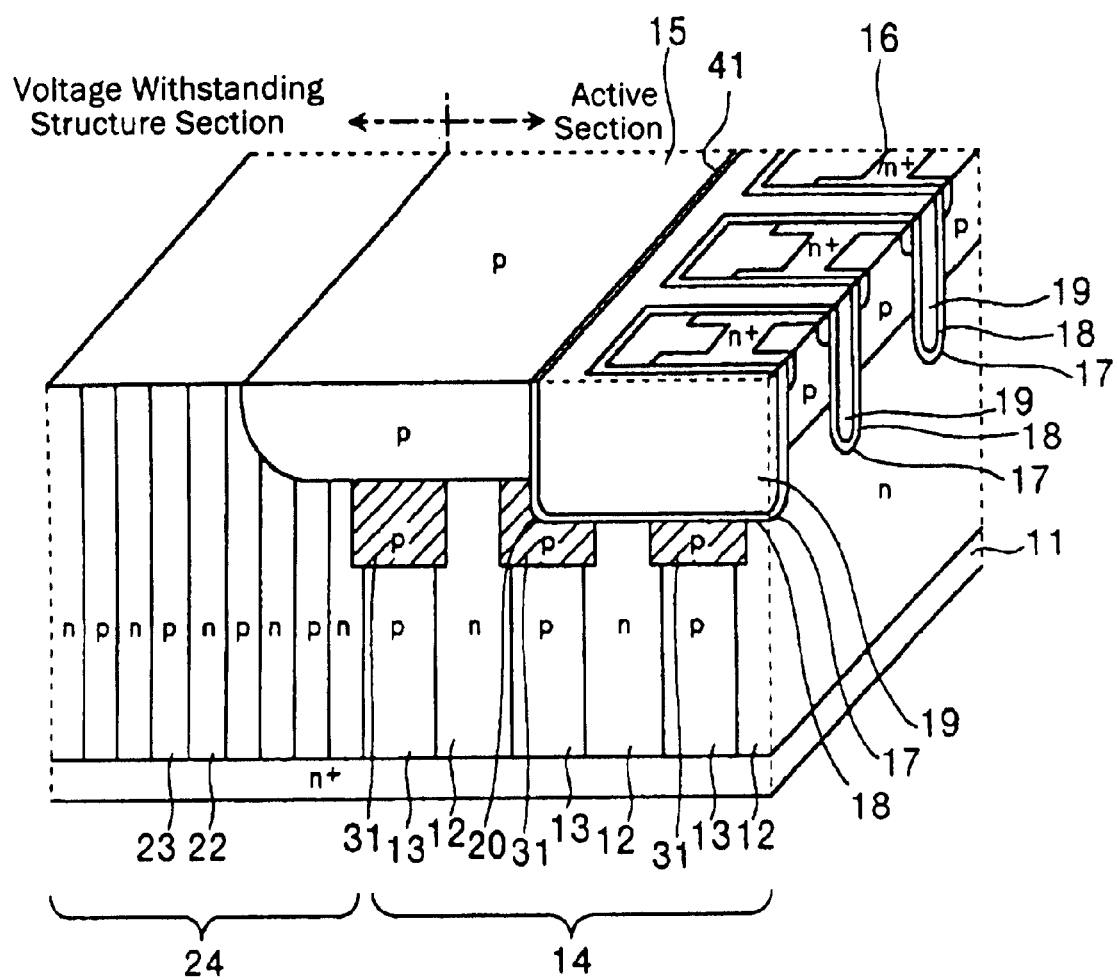
FIG. 7 is a perspective cross sectional view showing an arrangement of a principal part of a super junction semiconductor element according to the embodiment 4 of the invention.
Figure 8:
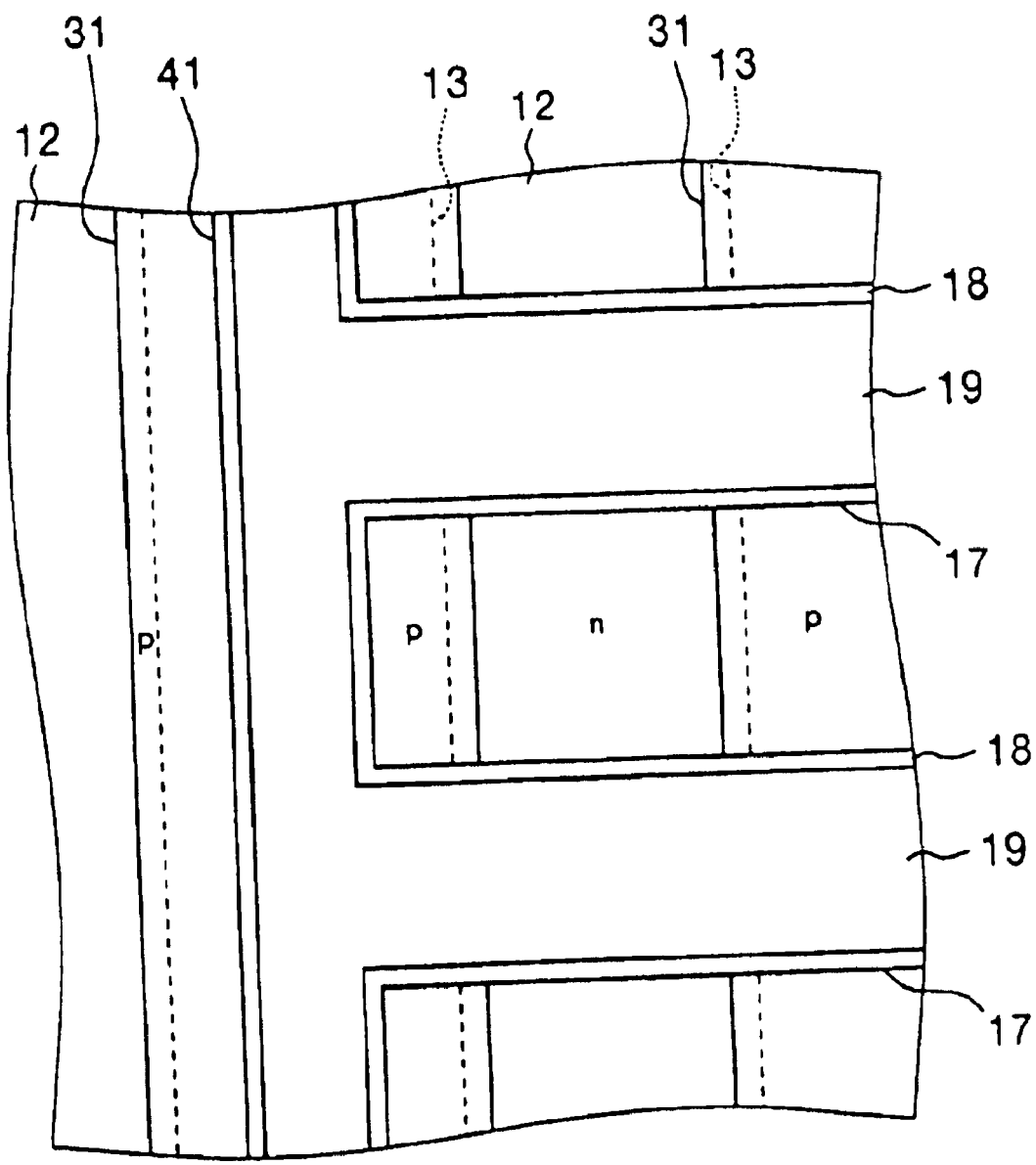
FIG. 8 is a schematic view showing a principal part in a planer structure at a depth near bottom portions of the trenches in the super junction semiconductor element shown in FIG. 7.

FIG. 7 is a perspective cross sectional view showing an arrangement of a principal part of a super junction semiconductor element according to the embodiment 4 of the invention. FIG. 8 is a schematic view showing a principal part in a planer structure at a depth near bottom portions of the trenches in the element. The embodiment 4 is provided by applying the embodiment 3 to the embodiment 2. Namely, in the embodiment 2, the second trench 41 is formed in the wider section 31 in the p-partition region 13 in the active section in parallel with the p-partition region 13. To the second trench 41, there is connected a part 20 in a shape of a three-dimensional curved surface to become an end portion of each of the trenches 17 in the second embodiment.

The width and the depth of the second trench 41 are the same as those in the embodiment 3 and are approximately 1

μm and 3.5 μm, respectively. The other arrangements, dimensions and impurity concentrations are the same as those in the embodiment 2. About the same arrangement as that in the embodiment 1 or the embodiment 2, the same reference numerals as those in the embodiment 1 or the embodiment 2 are given to the constituents therein and explanations thereof will be omitted.

According to the above-explained embodiment 4, the part 20 in a shape of a three-dimensional curved surface of the end portion of the trench is surrounded by the wider section 31 in the p-partition region 13. This causes an electric field when a reverse bias voltage is applied to the element to increase at a boundary between the wider section 31 in the p-partition region 13 and the n-drift region 12. Therefore, like in the embodiment 2, injection of hot carriers into the gate insulator film 18 is suppressed. Thus, there can be obtained an effect of increasing reliability of the gate insulator film 18, and along with this, allowing a desired breakdown voltage to be obtained. Furthermore, an effect of increasing an avalanche breakdown voltage can be obtained.

Embodiment 5

Figure 9:
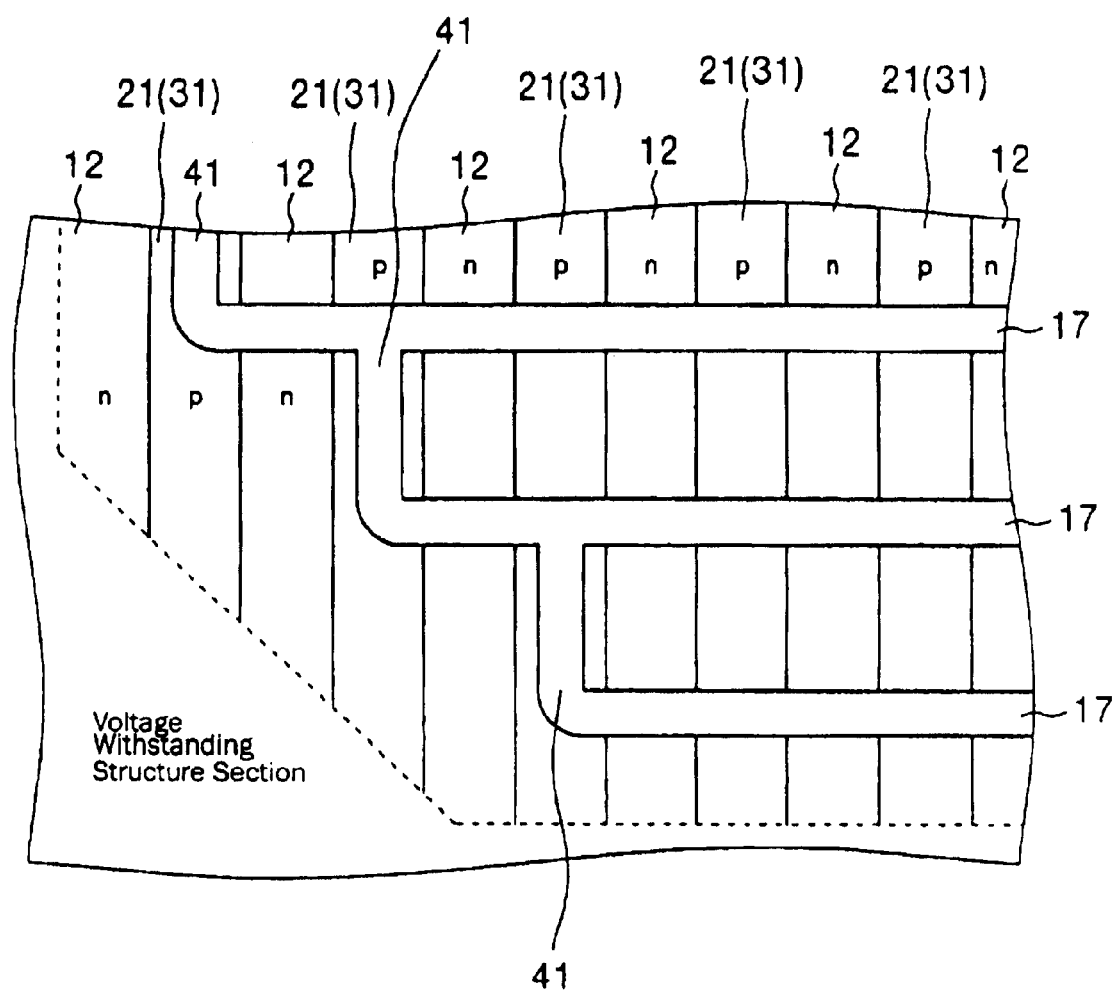
FIG. 9 is a schematic view showing a principal part in a planer structure at a depth near bottom portions of the trenches in a super junction semiconductor element according to the embodiment 5 of the invention.

FIG. 9 is a schematic view showing a principal part in a planer structure at a depth near bottom portions of the trenches in the super junction semiconductor element according to the embodiment 5 of the invention. The embodiment 5 is provided to have an arrangement in which in the embodiment 3 or the embodiment 4 the active region of the element is surrounded by trenches 17, being approximately perpendicular to the p+-regions 21 in the parallel p-n junction layer 14 or the wider sections 31 in the p-partition region 13, and by second trenches 41, being connected to the end portions of the trenches 17 and perpendicular to the trenches 17. The other arrangements are the same as those in the embodiment 3 or the embodiment 4. Thus, explanations thereof will be omitted. Therefore, by the embodiment 5, similar effects to those by the embodiment 3 or the embodiment 4 can be obtained.

Embodiment 6

Figure 10:
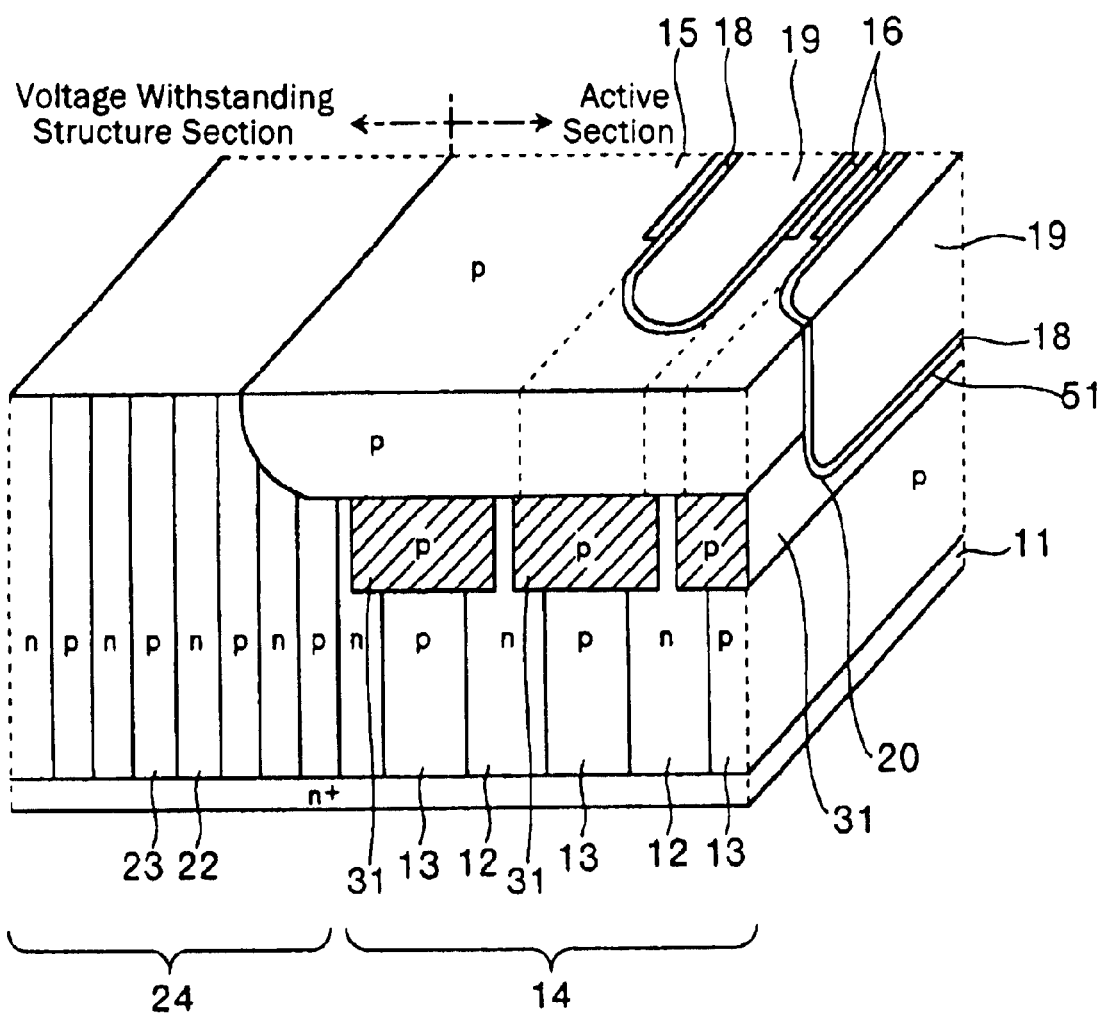
FIG. 10 is a perspective cross sectional view showing an arrangement of a principal part of a super junction semiconductor element according to the embodiment 6 of the invention.
Figure 11:
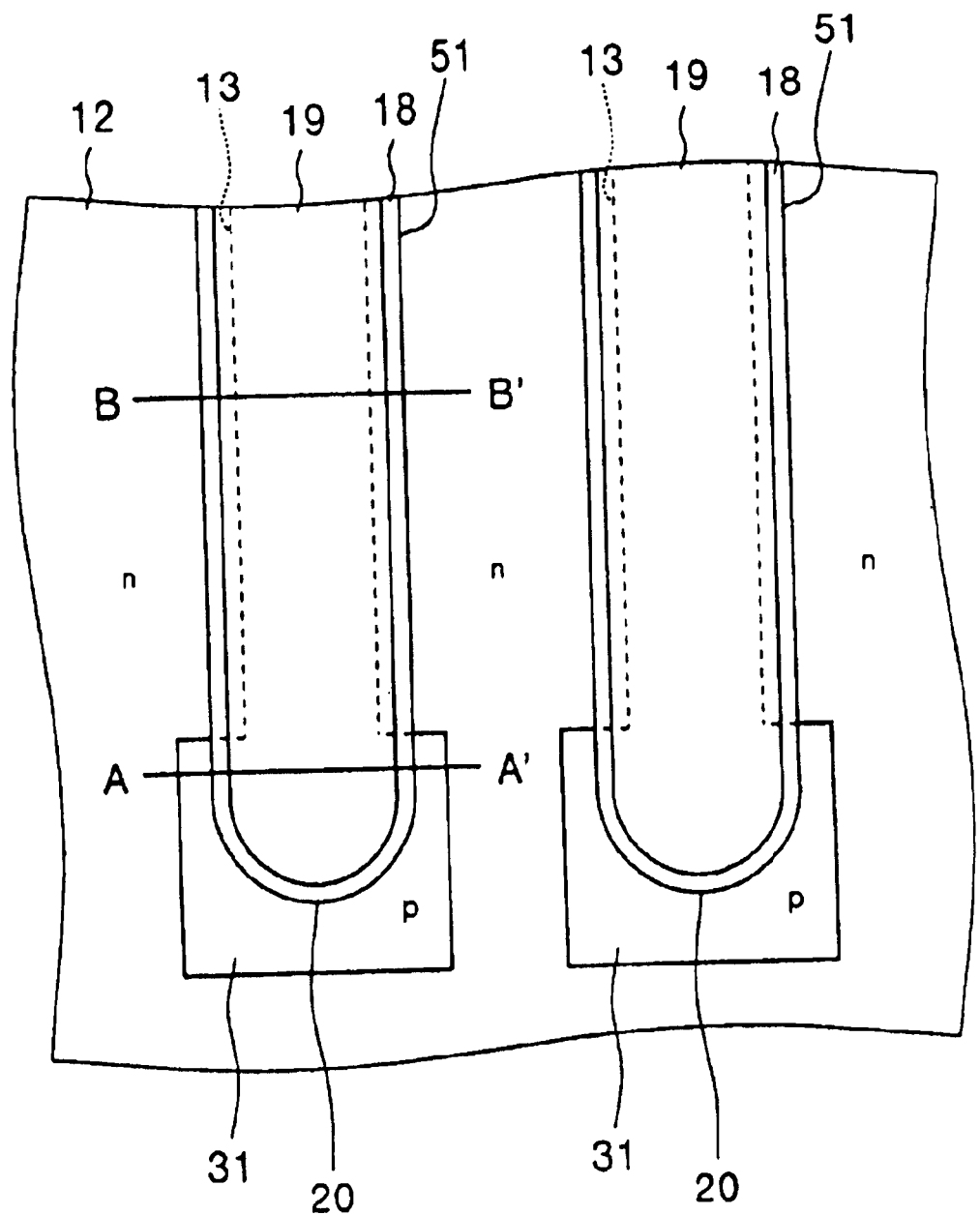
FIG. 11 is a schematic view showing a principal part in a planer structure at a depth near bottom portions of the trenches in the super junction semiconductor element shown in FIG. 10.
Figure 12:
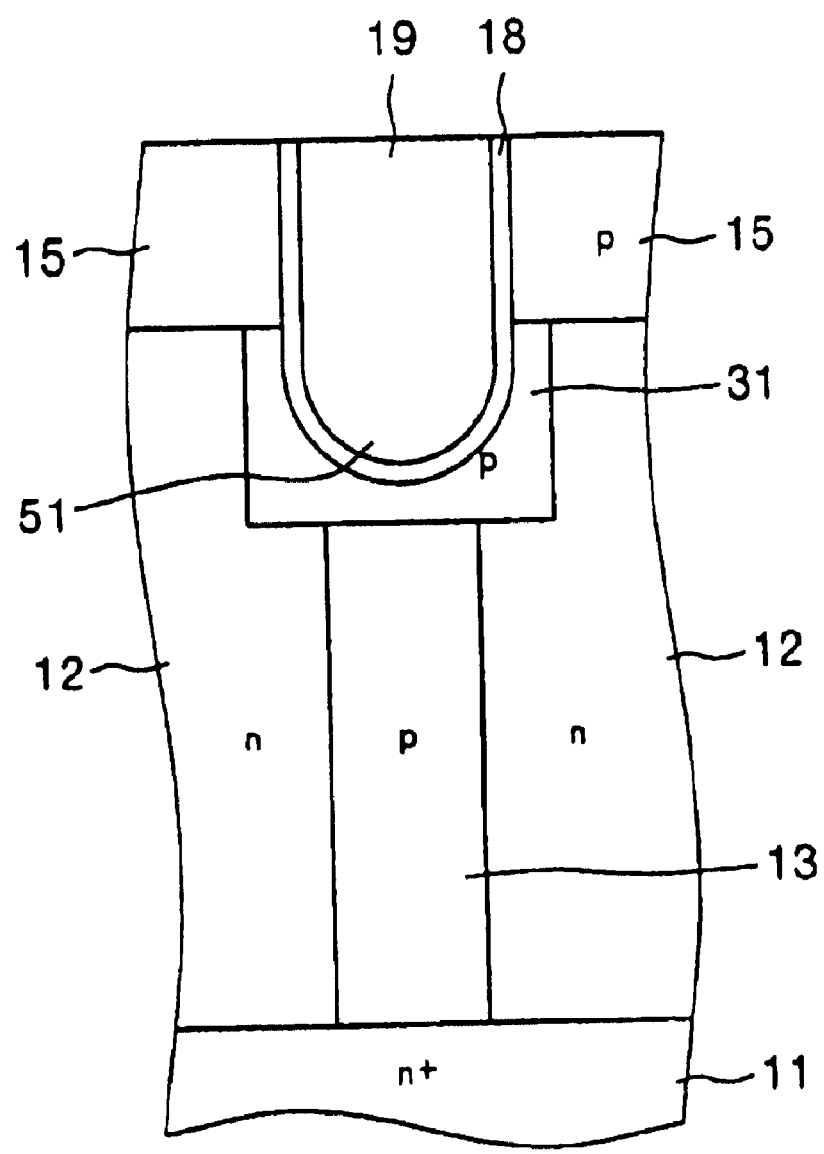
FIG. 12 is a vertical cross sectional view showing a structure in a cross section taken on line A—A' in FIG. 11.

FIG. 10 is a perspective cross sectional view showing an arrangement of a principal part of a super junction semiconductor element according to the embodiment 6 of the invention. FIG. 11 is a schematic view showing a principal part in a planer structure at a depth near bottom portions of the trenches in the element. Moreover, FIG. 12 is a vertical cross sectional view of a region near the end portion of the trench (a section taken on line A—A' in FIG. 11), and FIG. 13 is a vertical cross sectional view of a region that is not near the end portion of the trench, that is, an element active region (a section taken on line B—B' in FIG. 11).

As shown in FIG. 10, the embodiment 6 has an arrangement in which in the embodiment 2 trenches 51, extending along the p-partition regions 13 in parallel with thereto, are provided instead of the trenches 17 provided approximately perpendicularly to the p-partition regions 13 in the parallel p-n junction layer 14. Each of the trenches 51 is provided on the p-partition region 13 and the wider section 31 in the p-partition region 13. As shown in FIG. 11 and FIG. 12, the part 20 in a shape of a three-dimensional curved surface in the end portion of the trench 51 is surrounded by the wider section 31 in the p-partition regions 13.

Figure 13:
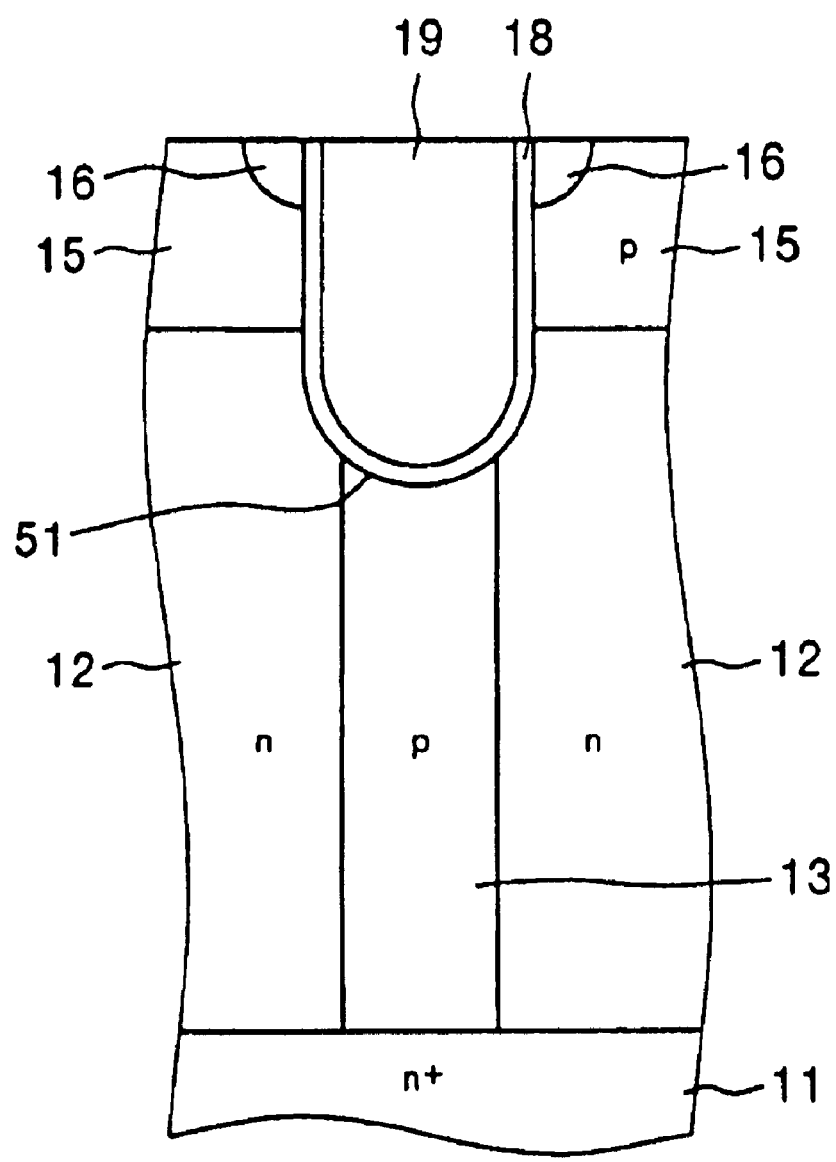
FIG. 13 is a vertical cross sectional view showing a structure in a cross section taken on line B—B' in FIG. 11.

Moreover, as shown in FIG. 11 and FIG. 13, in the part of the trench 51 except the end portion thereof, the width of the trench 51 is larger than the width of the p-partition region 13. This makes the sidewall section of the trench 51 in contact with the n-drift region 12 of the parallel p-n junction region 14. The bottom portion of the trench 51 is in contact with the p-partition region 13. The trench 51 is also filled in with the gate electrode 19 with the gate insulator film 18 put between the trench 17 and the gate electrode 18.

Here, the width of the trench 51 is, for example, 7 μm. Moreover, in a section near the end portion of the trench, the width of the wider section 31 in the p-partition region 13 is approximately 8 μm. Therefore, the width of the n-drift region 12 is approximately 4 μm. The other arrangements, dimensions and impurity concentrations are the same as those in the embodiment 2. About the same arrangement as that in the embodiment 1 or the embodiment 2, the same reference numerals as those in the embodiment 1 or the embodiment 2 are given to the constituents therein and explanations thereof will be omitted.

According to the above-explained embodiment 6, the part 20 in a shape of a three-dimensional curved surface of the end portion of the trench is surrounded by the wider section 31 in the p-partition region 13. This causes an electric field when a reverse bias voltage is applied to the element to increase at a boundary between the wider section 31 in the p-partition region 13 and the n-drift region 12. Therefore, like in the embodiment 2, injection of hot carriers into the gate insulator film 18 is suppressed. Thus, there can be obtained an effect of increasing reliability of the gate insulator film 18, and along with this, allowing a desired breakdown voltage to be obtained.

Embodiment 7

Figure 14:
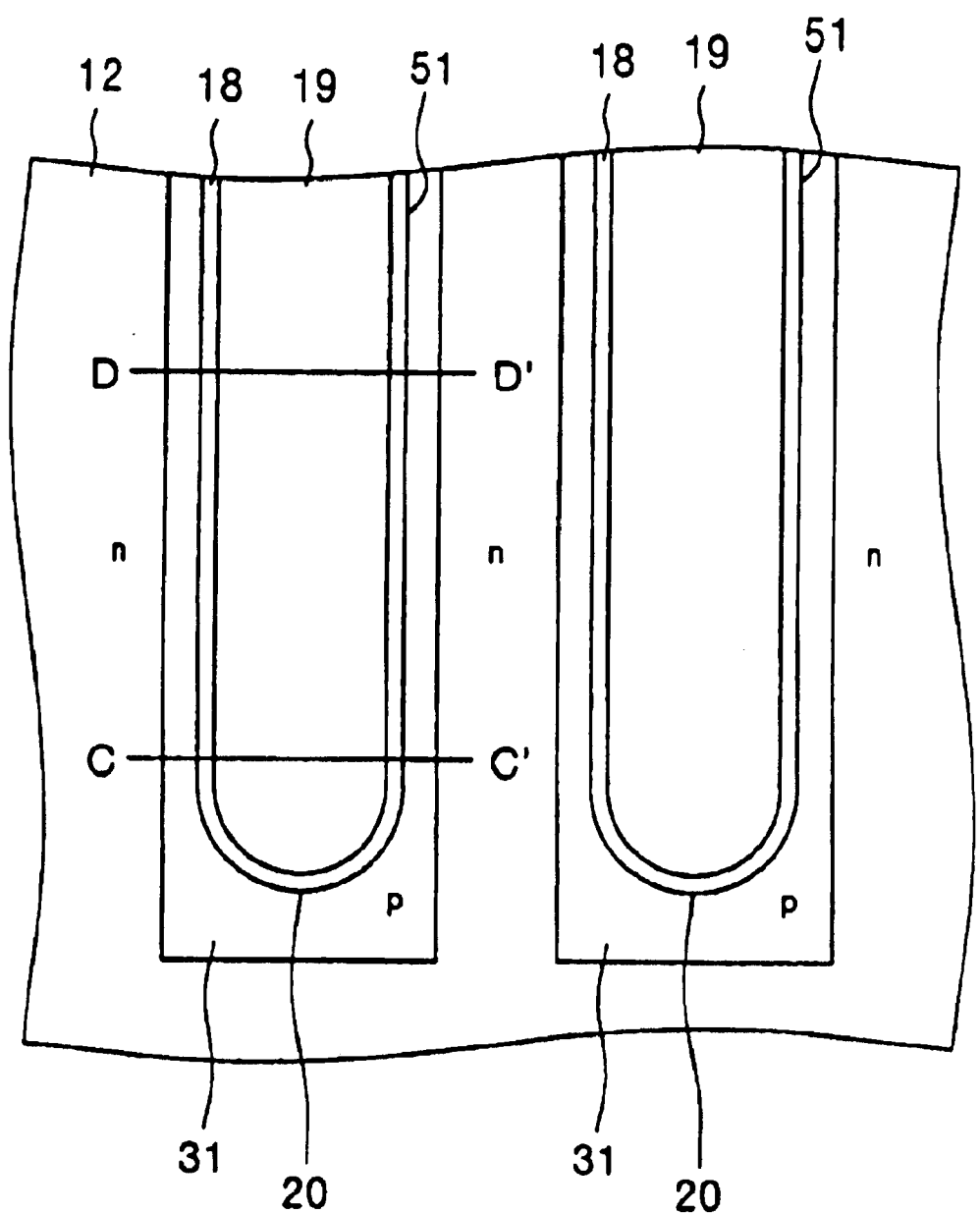
FIG. 14 is a schematic view showing a principal part in a planer structure at a depth near bottom portions of the trenches in a super junction semiconductor element according to the embodiment 7 of the invention.
Figure 15:
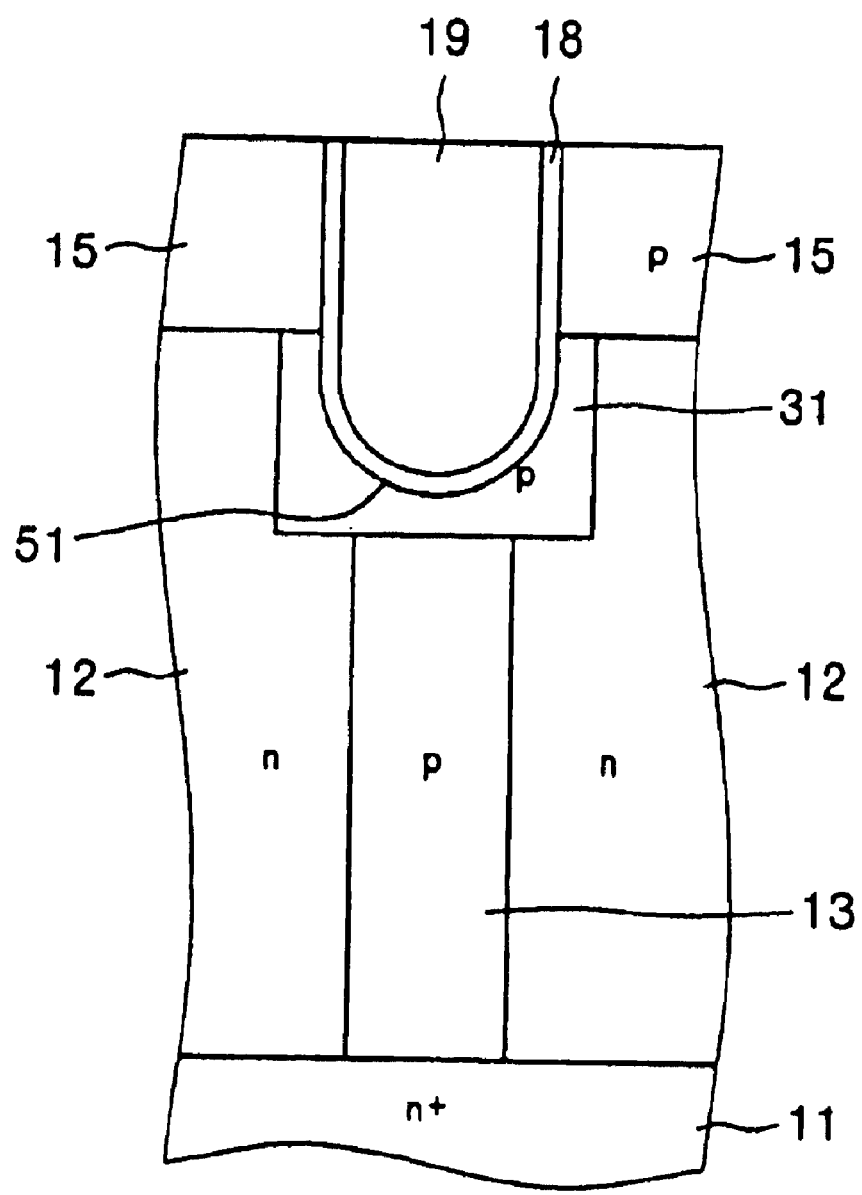
FIG. 15 is a vertical cross sectional view showing a structure in a cross section taken on line C—C' in FIG. 14.
Figure 16:
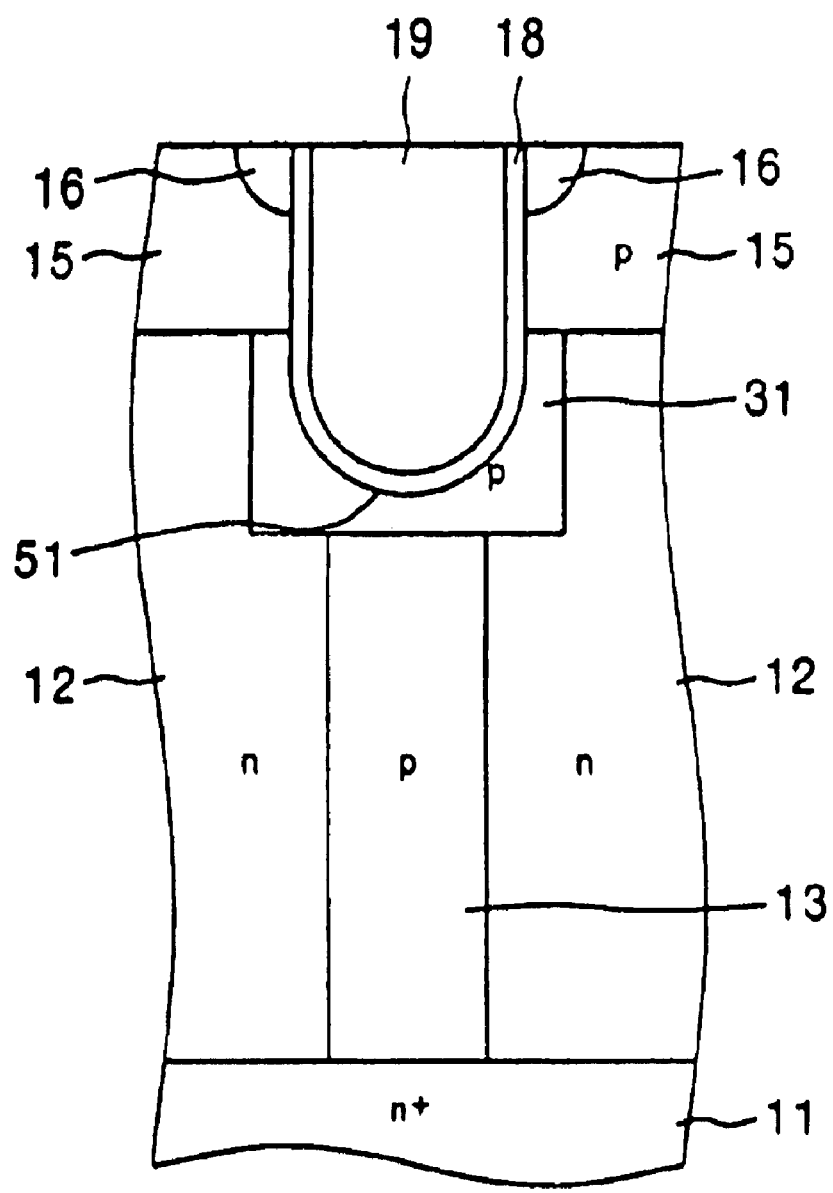
FIG. 16 is a vertical cross sectional view showing a structure in a cross section taken on line D—D' in FIG. 14.

FIG. 14 is a schematic view showing a principal part in a planer structure at a depth near bottom portions of the trenches in the super junction semiconductor element according to the embodiment 7 of the invention. Moreover, FIG. 15 is a vertical cross sectional view of a region near the end portion of the trench (a section taken on line C—C' in FIG. 14), and FIG. 16 is a vertical cross sectional view of a region that is not near the end portion of the trench, that is, an element active region (a section taken on line D—D' in FIG. 14).

As shown in FIG. 14, the embodiment 7 has an arrangement in which in the embodiment 6 the wider section 31 in the p-partition region 13 is provided not only in a region near the end portion of the trench 51 but also in the element active region in being along the trench 51. Therefore, the trench 51 is surrounded by the wider section 31 in the p-partition region 13 not only of course in the part 20 in a shape of a three-dimensional curved surface in the end portion thereof as shown in FIG. 14 and FIG. 15 but also in the section except the end portion as shown in FIG. 16. The other arrangements are the same as those in the embodiment 6. Thus, explanations thereof will be omitted. Therefore, by the embodiment 7, similar effects to those by the embodiment 6 can be obtained. Furthermore, since the wider sections 31 in the p-partition regions 13 are disposed in the active section, an effect of increasing an avalanche breakdown voltage can be obtained like in the embodiment 1.

In the foregoing, the invention can be variously modified without being limited to the above-described embodiments. For example, the above-explained values of the dimensions and the impurity concentrations are mere examples that are to impose no restriction on the invention. Moreover, in the embodiment 6 or the embodiment 7, an arrangement can be provided in which a second trench is provided perpendicularly to the trenches 51 like in the example 3 or the example 4 to connect the end portions of the trenches 51 to the second trench. In this case, an arrangement can be provided in which the trenches 51 and the second trench surround the element active region like in the embodiment 5. Furthermore, the invention, without being limited to the MOSFETs, can be applied to elements such as IGBTs and bipolar transistors.

According to the invention, in a region allowing a current to flow in a turned-on state, a part in a shape of a three-dimensional curved surface of the end portion of the trench is surrounded by the section with a higher impurity concentration or with a larger width in the second conduction type partition region in the parallel p-n junction layer. This increases electric field strength at a boundary between the section with a higher impurity concentration or with a larger width in the second conduction type partition region and the first conduction type drift region. Therefore, concentration of electric field strength to the part in a shape of a three-dimensional curved surface of the end portion of the trench is lessened. This can lessen hot carriers injected into the gate insulator film, by which reliability of the gate insulator film is increased and, along a with this, a break down voltage can be made stabilized.

What is claimed is:

1. In a semiconductor device comprising:

a low resistance layer;

a parallel p-n junction layer;

a gate electrode;

a base region of a second conduction type; and a source region of a first conduction type, the low resistance layer, the parallel p-n junction layer, the gate electrode, the base region, and the source region being provided between a first principal surface and a second principal surface of a semiconductor substrate, the parallel p-n junction layer comprising a plurality of first conduction type regions and a plurality of second conduction type regions both extending in the vertical direction from the first principal surface side toward the second principal surface side, and being alternately joined in a lateral direction, the gate electrode filling each of trenches formed on the first principal surface side with a gate insulator film provided between the gate electrode and the trench, the base region of the second conduction type being made in contact with at least a part of a section of the gate insulator film along a side wall of the trench, and the source region of the first conduction type being separated from the first conduction type regions by the base region of the second conduction type and being made in contact with the section along the side wall of the trench, the improvement wherein second conduction type regions as a part of a plurality of the second conduction type regions have end portions of the trenches formed therein.

2. The semiconductor element as claimed in claim 1 wherein, about each of the second conduction type regions with the end portions of the trenches formed therein of a plurality of the second conduction type regions, an impurity concentration in a section surrounding the end portion of the trench is higher than an impurity concentration in a section on the second principal surface side.

3. The semiconductor element as claimed in claim 2 wherein the section with a higher impurity concentration surrounding the end portion of the trench in the second conduction type region having the end portion of the trench formed therein is disposed in the second conduction type region in the parallel p-n junction layer disposed in a region allowing a current to flow in a turned-on state.

4. The semiconductor element as claimed in claim 1 wherein, about each of the second conduction type regions with the end portions of the trenches formed therein of a plurality of the second conduction type regions, a width of a section surrounding the end portion of the trench is larger than a width in a section on the second principal surface side.

5. The semiconductor element as claimed in claim 4 wherein the section with a larger width surrounding the end portion of the trench in the second conduction type region having the end portion of the trench formed therein is disposed in the second conduction type region in the parallel p-n junction layer disposed in a region allowing a current to flow in a turned-on state.

* * * * *